US009685506B2

(12) United States Patent
Udrea et al.

(10) Patent No.: US 9,685,506 B2
(45) Date of Patent: Jun. 20, 2017

(54) IGBT HAVING AN INTER-TRENCH SUPERJUNCTION STRUCTURE

(71) Applicant: Infineon Technologies Americas Corp., El Segundo, CA (US)

(72) Inventors: Florin Udrea, Cambridge (GB); Alice Pei-Shan Hsieh, Cambridge (GB); Gianluca Camuso, Cambridge (GB); Chiu Ng, El Segundo, CA (US); Yi Tang, Torrance, CA (US); Rajeev Krishna Vytla, Los Angeles, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/986,355

(22) Filed: Dec. 31, 2015

(65) Prior Publication Data

US 2016/0260799 A1 Sep. 8, 2016

Related U.S. Application Data

(60) Provisional application No. 62/128,922, filed on Mar. 5, 2015.

(51) Int. Cl.
*H01L 29/06* (2006.01)
*H01L 29/739* (2006.01)
*H01L 29/10* (2006.01)

(52) U.S. Cl.
CPC ...... *H01L 29/0634* (2013.01); *H01L 29/0696* (2013.01); *H01L 29/7397* (2013.01); *H01L 29/1095* (2013.01)

(58) Field of Classification Search
CPC ............. H01L 2924/00; H01L 29/0634; H01L 29/1095; H01L 29/7813; H01L 29/7811;
(Continued)

(56) References Cited

U.S. PATENT DOCUMENTS 8,304,814 B2 11/2012 Bauer
9,024,383 B2 5/2015 Gamerith et al.
(Continued)

OTHER PUBLICATIONS

M. Antoniou, F. Udrea and F. Bauer, "Optimization of Super Junction Bipolar Transistor for Ultra-fast Switching Applications", Proc. ISPSD'2007, p. 101-104.
(Continued)

*Primary Examiner* — Chuong A Luu
*Assistant Examiner* — Rodolfo D Fortich
(74) *Attorney, Agent, or Firm* — Murphy, Bilak & Homiller, PLLC

(57) ABSTRACT

There are disclosed herein implementations of an insulated-gate bipolar transistor (IGBT) having an inter-trench superjunction structure. Such an IGBT includes a drift region having a first conductivity type situated over a collector having a second conductivity type. The IGBT also includes first and second gate trenches extending through a base having the second conductivity type into the drift region, the first and second gate trenches each being bordered by an emitter diffusion having the first conductivity type. In addition, the IGBT includes an inter-trench superjunction structure situated in the drift region between the first and second gate trenches. The inter-trench superjunction structure includes one or more first conductivity regions having the first conductivity type and two or more second conductivity region having the second conductivity type, the one or more first conductivity regions and the two or more second conductivity regions configured to substantially charge-balance the inter-trench superjunction structure.

20 Claims, 4 Drawing Sheets

(58) Field of Classification Search
CPC ............ H01L 29/7397; H01L 29/0696; H01L 29/0878; H01L 29/7802; H01L 29/407
USPC ................ 257/155, 329, 268, 139, 330, 142
See application file for complete search history.

(56) References Cited

U.S. PATENT DOCUMENTS

| | | |
|---|---|---|
| 9,093,522 B1 | 7/2015 | Zeng et al. |
| 2008/0135929 A1 | 6/2008 | Saito et al. |
| 2010/0264488 A1 | 10/2010 | Hsieh |
| 2011/0084333 A1 | 4/2011 | Disney |
| 2011/0233684 A1* | 9/2011 | Matsushita ......... H01L 29/1095 257/378 |
| 2012/0001199 A1* | 1/2012 | Bauer .................. H01L 29/749 257/77 |
| 2014/0077289 A1 | 3/2014 | Miyajima |
| 2014/0097517 A1 | 4/2014 | Moens |

OTHER PUBLICATIONS

M. Antoniou, F. Udrea, and F. D. Bauer, "The superjunction insulated gate bipolar transistor-Optimization and modeling," IEEE Trans. Electron Devices, vol. 57, No. 3, p. 594-600, Mar. 2010.
M. Antoniou, F. Udrea, F. D. Bauer, A. Mihaila, and I. Nistor "Towards Achieving the Soft-Punch-Through Superjunction Insulated-Gate Bipolar Transistor Breakdown Capability", IEEE Electron Device Letters, vol. 32, No. 9, Sep. 2011, p. 1275-1277.
F. Bauer, I. Nistor, A. Mihaila, M. Antoniou, and F. Udrea "Superjunction IGBT Filling the Gap Between SJ MOSFET and Ultrafast IGBT", IEEE Electron Device Letters, vol. 33, No. 9, Sep. 2012, p. 1288-1290.

* cited by examiner

IGBT HAVING AN INTER-TRENCH SUPERJUNCTION STRUCTURE

BACKGROUND

The present application claims the benefit of and priority to a provisional application titled "Super Junction IGBT with PNN Structure for High Frequency Applications," Ser. No. 62/128,922 filed on Mar. 5, 2015. The disclosure in this provisional application is hereby incorporated fully by reference into the present application.

BACKGROUND ART

Insulated-gate bipolar transistors (IGBTs) may be implemented in a variety of applications. For instance, IGBTs may be used as power switches in motor drive inverters, as well as in direct-current (DC) to DC power converters. In these and other power applications, turn-off losses ($E_{OFF}$) and on-state voltage drop ($V_{ON}$) are typically key operating parameters, so that IGBTs having low $V_{ON}$ and substantially minimized $E_{OFF}$ during fast switching are highly desirable.

However, as switching speed increases, switching losses, including $E_{OFF}$, typically represent a significant portion of total power loss by an IGBT. Moreover, conventional techniques for minimizing $E_{OFF}$ during fast switching can have undesirable consequences for the on-state characteristics of the IGBT, such as $V_{ON}$.

SUMMARY

The present disclosure is directed to an insulated-gate bipolar transistor (IGBT) having an inter-trench superjunction structure, substantially as shown in and/or described in connection with at least one of the figures, and as set forth in the claims.

DETAILED DESCRIPTION

Figure 1:
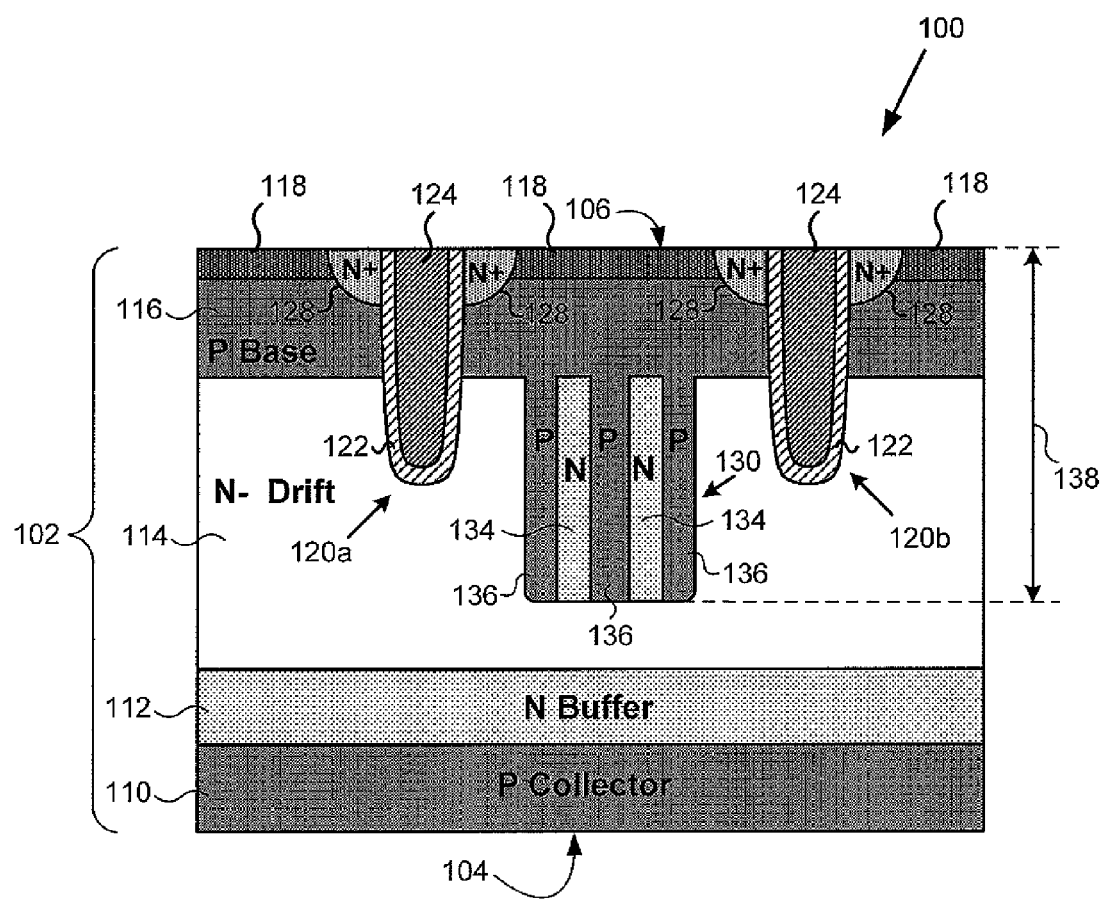
FIG. 1 presents a cross-sectional view showing a portion of an exemplary insulated-gate bipolar transistor (IGBT) having an inter-trench superjunction structure, according to one implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 presents a cross-sectional view showing a portion of exemplary insulated-gate bipolar transistor (IGBT) 100 having an inter-trench superjunction structure, according to one implementation. As shown in FIG. 1, IGBT 100 is implemented as a vertical power device including P type collector 110 at bottom surface 104 of semiconductor substrate 102, and N type drift region 114 situated over P type collector 110. In addition, P type base 116 is situated over N type drift region 114. As further shown in FIG. 1, IGBT 100 includes N type buffer or field stop layer 112 (hereinafter "buffer layer 112"), as well as N type emitter diffusions 128 and P type contacts 118 formed in P type base 116.

IGBT 100 also includes first gate trench 120a and second gate trench 120b, each extending from top surface 106 of semiconductor substrate 102, through P type base 116, and into N type drift region 114. As further shown in FIG. 1, each of first gate trench 120a and second gate trench 120b is bordered by N type emitter diffusions 128, and includes gate insulator 122 and gate electrode 124. In addition, IGBT 100 includes inter-trench superjunction structure 130, situated in N type drift region 114 between first gate trench 120a and second gate trench 120b, and extending to a depth 138 below top surface 106 of semiconductor substrate 102.

As shown in FIG. 1, inter-trench superjunction structure 130 includes one or more N type regions 134 and two or more P type regions 136. One or more N type regions 134 and two or more P type regions 136 are configured to substantially charge-balance inter-trench superjunction structure 130.

It is noted that, in operation, IGBT 100 is configured to produce conduction channels through P type base 116 in regions beneath N type emitter diffusions 128 and immediately adjacent first gate trench 120a and second gate trench 120b. Thus, when IGBT 100 is turned on, conduction channels (not shown as such in FIG. 1) are produced as N type conduction channels through P type base 116 so as to enable transfer of charge carriers between N type emitter diffusions 128 and P type collector 110.

It is further noted that although the implementation shown in FIG. 1 depicts IGBT 100 as having P type collector 110, N type buffer layer 112, N type drift region 114, P type base 116, N type emitter diffusions 128, and as being configured to produce N type conduction channels, that representation is merely exemplary. In other implementations, the described polarities can be reversed. That is to say, IGBT 100 may have an N type layer corresponding to P type collector 110, a P type buffer layer, a P type drift region, an N type base, P type diffusions corresponding to N type emitter diffusions 128, and may be configured to produce P type conduction channels adjacent first gate trench 120a and second gate trench 120b.

Semiconductor substrate 102 may be a silicon (Si) substrate or a silicon carbide (SiC) substrate, for example. In some implementations, semiconductor substrate 102 may include N type drift region 114 and P type base 116 formed in an epitaxial silicon layer of semiconductor substrate 102. Formation of such an epitaxial silicon layer may be performed by any suitable method, as known in the art, such as chemical vapor deposition (CVD) or molecular beam epitaxy (MBE), for example. More generally, however, N type drift region 114 and P type base 116 may be formed in any suitable elemental or compound semiconductor layer included in semiconductor substrate 102.

Thus, in other implementations, N type drift region 114 and P type base 116 need not be formed through epitaxial growth, and/or need not be formed of silicon. For example, in one alternative implementation, N type drift region 114 and P type base 116 can be formed in a float zone silicon layer of semiconductor substrate 102. In other implementations, N type drift region 114 and P type base 116 can be formed in either a strained or unstrained germanium layer formed as part of semiconductor substrate 102. Moreover, in some implementations, semiconductor substrate 102 may include additional layers, such as N type buffer layer 112 situated between P type collector 110 and N type drift region 114, as shown in FIG. 1.

P type base 116 may be formed by implantation and thermal diffusion. For example, boron (B) dopants may be implanted into semiconductor substrate 102 and diffused to form P type base 116. Moreover, P type contacts 118 of P type base 116 may be more highly doped regions of P type base 116 utilizing the same dopant species used to form P type base 116.

Gate insulator 122 may be formed using any material and any technique typically employed in the art. For example, gate insulator 122 may be formed of silicon oxide, and may be deposited or thermally grown to line gate trench 120. Gate electrodes 124 may also be formed using any material typically utilized in the art. For example, gate electrodes 124 may be formed of doped polysilicon or metal. Although not explicitly shown in FIG. 1, gate electrodes 124 can be electrically connected to one another in the third dimension relative to the cross-sectional perspective shown by FIG. 1.

As shown in FIG. 1, each of first gate trench 120a and second gate trench 120b is bordered by N type emitter diffusions 128. N type emitter diffusions 128 may be selectively formed in P type base 116 using any conventional techniques known in the art. For example, phosphorus (P) or arsenic (As) dopants may be implanted into P type base 116 and diffused to form N type emitter diffusions 128. As is the case for gate electrodes 124, and although also not explicitly shown in FIG. 1, N type emitter diffusions 128 can be electrically connected to one another in the third dimension relative to the cross-sectional perspective shown by FIG. 1.

As noted above, inter-trench superjunction structure 130 includes at least one N type region 134 and at least two P type regions 136. It is further noted that, as shown in FIG. 1, N type region or regions 134 may take the form of N type conductive pillar(s) situated between first gate trench 120a and second gate trench 120b and extending toward collector 110 (hereinafter "N type conductive pillar(s) 134"). In addition, and as also shown in FIG. 1, P type regions 136 may take the form of P type conductive pillars situated between first gate trench 120a and second gate trench 120b and extending toward collector 110 (hereinafter "P type conductive pillars 136"). Moreover, in some implementations, inter-trench superjunction structure 130 may include multiple N type conductive pillars 134 as well as multiple P type conductive pillars 136. However, in all implementations, the number of P type conductive pillars 136 exceeds the number of N type conductive pillar(s) 134.

In one implementation, for example, inter-trench superjunction structure 130 may include two P type conductive pillars 136 and one N type conductive pillar 134 situated between and adjoining the two P type conductive pillars 136. In another exemplary implementation, inter-trench superjunction structure 130 may include multiple N type conductive pillars 134 and multiple P type conductive pillars 136, where each N type conductive pillar 134 is situated between two P type conductive pillars 136.

N type conductive pillar(s) 134 and P type conductive pillars 136 of inter-trench superjunction structure 130 may have a doping concentration greater than that of N type drift region 114 and less than that of N type emitter diffusions 128. In one implementation, N type conductive pillar(s) 134 and P type conductive pillars 136 may have a doping concentration substantially equal to that of N type buffer layer 112. For example, N type conductive pillar(s) 134 and P type conductive pillars 136 may have a doping concentration of from approximately $1 \times 10^{15}/cm^3$ to approximately $1 \times 10^{16}/cm^3$, while the doping concentration of N type drift region 114 is typically from approximately $1 \times 10^{13}/cm^3$ to approximately $2 \times 10^{14}/cm^3$.

It is noted that inter-trench superjunction structure 130 is not situated under first gate trench 120a or under second gate trench 120b. That is to say, inter-trench superjunction structure 130 is situated between first gate trench 120a and second gate trench 120b, but does not extend under either of first gate trench 120a or second gate trench 120b. Moreover, according to the exemplary implementation shown in FIG. 1, inter-trench superjunction structure 130 adjoins P type base 116 and terminates in N type drift region 114 at depth 138, which is above N type buffer layer 112. In other words, in some implementations, inter-trench superjunction structure 130 is spaced apart from N type buffer layer 112 by N type drift region 114.

As noted above, N type conductive pillar(s) 134 and P type conductive pillars 136 are configured to substantially charge-balance inter-trench superjunction structure 130. That substantial charge-balance of inter-trench superjunction structure 130 is achieved when the surface doping density of N type conductive pillar(s) 134, which equals the doping density of N type conductive pillar(s) 134 multiplied by the area of N conductive pillar(s) 134 (i.e., width×depth) is substantially equal to the surface doping density of P type conductive pillars 136, which is analogously calculated. During turn-off of IGBT 100, the depletion region extends rapidly from the top of N type drift region 114 to N type buffer layer 112 due to the two-dimensional fast depletion of N type conductive pillar(s) 134 and P type conductive pillars 136, which also enables fast extraction of deep charge carriers.

As a result, the delay time and turn-off time of IGBT 100 can be reduced, while voltage blocking in the off-state is facilitated by the presence of inter-trench superjunction structure 130. During turn-off, charge-balanced inter-trench superjunction structure 130 assists in removal of charge carriers from N type drift region 114, which is conductivity modulated, thereby significantly enhancing the switching speed and turn-off performance of IGBT 100. In other words, charge-balanced inter-trench superjunction structure 130 enables IGBT 100 to have lower turn-off losses ($E_{OFF}$), shorter delay time ($T_d$), and shorter turn-off time ($T_f$), when compared to conventional IGBTs. Moreover, the above advantages may be achieved while maintaining the on-state voltage drop ($V_{ON}$) of IGBT 100 at a desirably low level.

Figure 2:
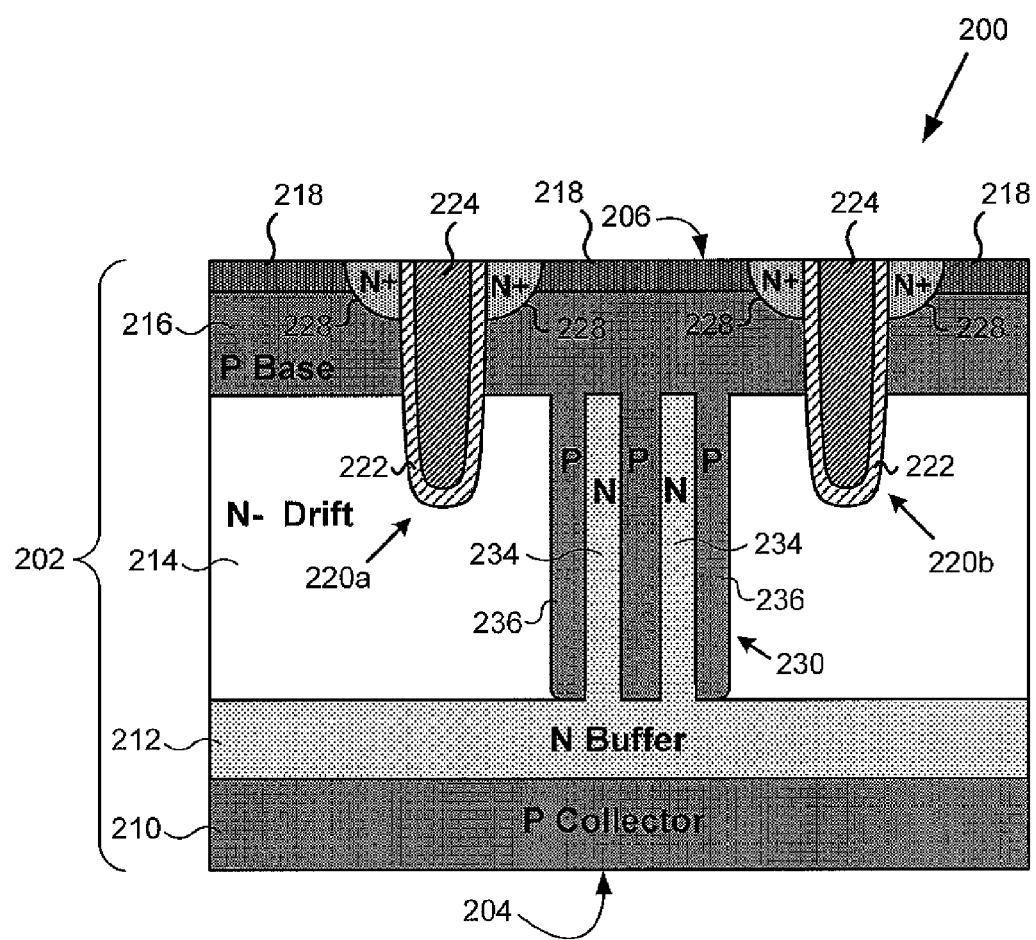
FIG. 2 presents a cross-sectional view showing a portion of an exemplary IGBT having an inter-trench superjunction structure, according to another implementation.

Continuing to FIG. 2, FIG. 2 presents a cross-sectional view showing a portion of exemplary IGBT 200 having an inter-trench superjunction structure, according to another implementation. As shown in FIG. 2, IGBT 200 is implemented as a vertical power device including P type collector 210 at bottom surface 204 of semiconductor substrate 202, and N type drift region 214 situated over P type collector 210. In addition, P type base 216 is situated over N type drift region 214. As further shown in FIG. 2, IGBT 200 includes N type buffer layer 212, as well as N type emitter diffusions 228 and P type contacts 218 formed in P type base 216.

IGBT 200 also includes first gate trench 220a and second gate trench 220b, each extending from top surface 206 of semiconductor substrate 202, through P type base 216, and into N type drift region 214. As further shown in FIG. 2, each of first gate trench 220a and second gate trench 220b is bordered by N type emitter diffusions 228, and includes gate insulator 222 and gate electrode 224. In addition, IGBT 200 includes inter-trench superjunction structure 230 situated in N type drift region 214 between first gate trench 220a and second gate trench 220b.

As shown in FIG. 2, inter-trench superjunction structure 230 includes one or more N type regions 234 and two or more P type regions 236. One or more N type regions 234 and two or more P type regions 236 may be implemented as conductive pillars (hereinafter "N type conductive pillar(s) 234" and "P type conductive pillars 236", respectively) extending toward collector 210. N type conductive pillar(s) 234 and P type conductive pillars 236 are configured to substantially charge-balance inter-trench superjunction structure 230.

IGBT 200 corresponds in general to IGBT 100, in FIG. 1. That is to say, semiconductor substrate 202, P type collector 210, N type buffer layer 212, and N type drift region 214, in FIG. 2, correspond respectively in general to semiconductor substrate 102, P type collector 110, N type buffer layer 112, and N type drift region 114, in FIG. 1, and may share any of the characteristics attributed to those corresponding features, above.

In addition, P type base 216, P type contacts 218, and N type emitter diffusions 228, in FIG. 2, correspond respectively in general to P type base 116, P type contacts 118, and N type emitter diffusions 128, in FIG. 1 and may share any of the characteristics attributed to those corresponding features, above. Moreover, first gate trench 220a and second gate trench 220b each including gate insulator 222 and gate electrode 224, in FIG. 2, correspond respectively in general to first gate trench 120a and second gate trench 120b each including gate insulator 122 and gate electrode 124, in FIG. 1, and may share any of the characteristics attributed to those corresponding features, above.

As shown in FIG. 2, inter-trench superjunction structure 230 includes at least one N type conductive pillar 234 and at least two P type conductive pillars 236. Moreover, and as further shown in FIG. 2, in some implementations, inter-trench superjunction structure 230 may include multiple N type conductive pillars 234 and multiple P type conductive pillars 236. However, in all implementations, the number of P type conductive pillars 236 exceeds the number of N type conductive pillar(s) 234.

In one implementation, for example, inter-trench superjunction structure 230 may include two P type conductive pillars 236 and one N type conductive pillar 234 situated between and adjoining the two P type conductive pillars 236. In another exemplary implementation, inter-trench superjunction structure 230 may include multiple N type conductive pillars 234 and multiple P type conductive pillars 236, where each N type conductive pillar 234 is situated between two P type conductive pillars 236.

N type conductive pillar(s) 234 and P type conductive pillars 236 correspond in general to N type conductive pillar(s) 134 and P type conductive pillars 136, in FIG. 1, and may share any of the characteristics attributed to those corresponding features, above. It is noted that inter-trench superjunction structure 230 is not situated under first gate trench 220a or under second gate trench 220b. That is to say, inter-trench superjunction structure 230 is situated between first gate trench 220a and second gate trench 220b, but does not extend under either of first gate trench 220a or second gate trench 220b.

Moreover, according to the exemplary implementation shown in FIG. 2, inter-trench superjunction structure 230 extends through N type drift region 214 to adjoin N type buffer layer 212. That is to say, according to the implementation shown in FIG. 2, inter-trench superjunction structure 230 extends through N type drift region 214 so as to adjoin N type buffer layer 212, while also adjoining P type base 216. As a result, in implementations in which inter-trench superjunction structure 230 adjoins both P type base 216 and N type buffer layer 212, inter-trench superjunction structure 230 can form multiple PN junctions with N type drift region 214. For example, as shown in FIG. 2, N type drift region 214 may adjoin two of P type conductive pillars 236 to form two PN junctions with inter-trench superjunction structure 230, while not adjoining any N type conductive pillar(s) 234.

As noted above, N type conductive pillar(s) 234 and P type conductive pillars 236 are configured to substantially charge-balance inter-trench superjunction structure 230. During turn-off of IGBT 200, the depletion region extends rapidly from the top of N type drift region 214 to N type buffer layer 212 due to the two-dimensional fast depletion of N type conductive pillar(s) 234 and P type conductive pillars 236, which also enables fast extraction of deep charge carriers.

As a result, the delay time and turn-off time of IGBT 200 can be reduced, while voltage blocking in the off-state is facilitated by the presence of inter-trench superjunction structure 230. During turn-off, charge-balanced inter-trench superjunction structure 230 assists in removal of charge carriers from N type drift region 214, which is conductivity modulated, thereby significantly enhancing the switching speed and turn-off performance of IGBT 200. In other words, charge-balanced inter-trench superjunction structure 230 enables IGBT 200 to have lower $E_{OFF}$, shorter $T_d$, and shorter $T_f$, when compared to conventional IGBTs. Moreover, the above advantages may be achieved while maintaining the $V_{ON}$ of IGBT 200 at a desirably low level.

Figure 3:
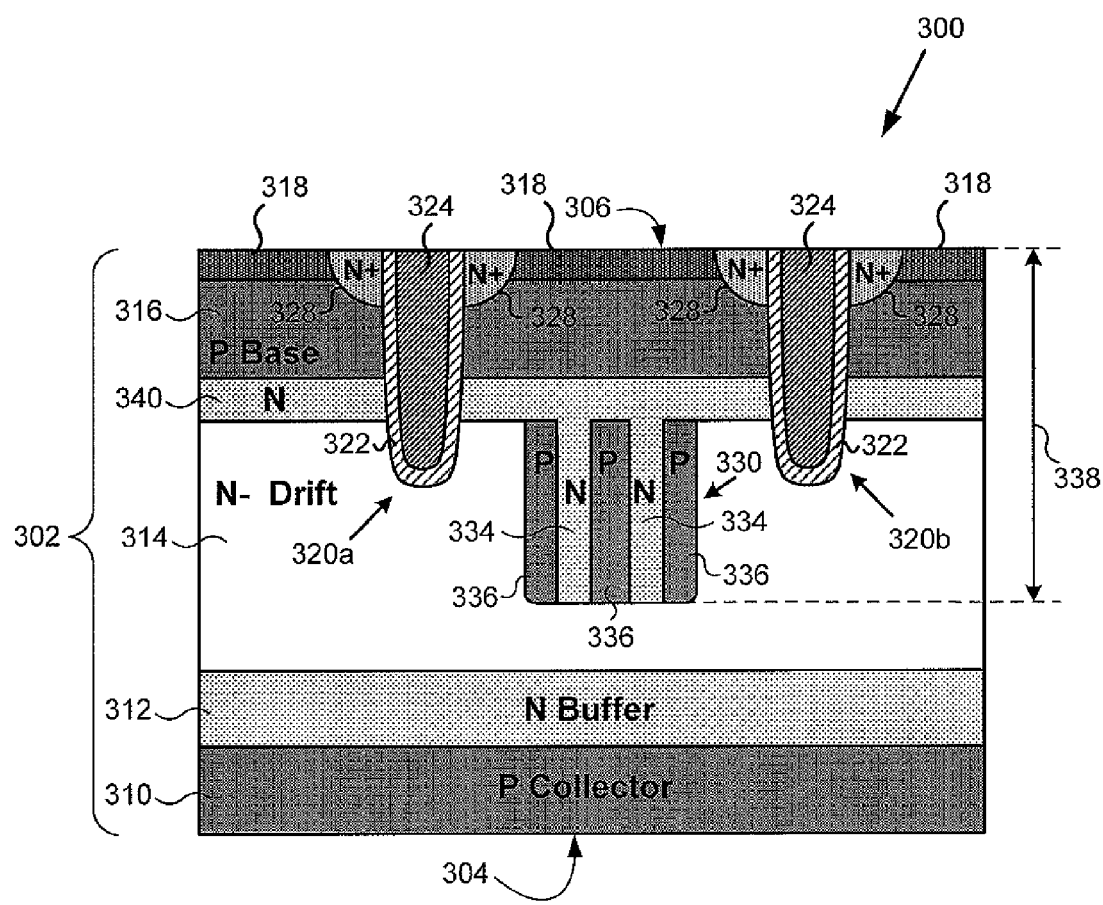
FIG. 3 presents a cross-sectional view showing a portion of an exemplary IGBT having an inter-trench superjunction structure, according to yet another implementation.

Moving to FIG. 3, FIG. 3 presents a cross-sectional view showing a portion of exemplary IGBT 300 having an inter-trench superjunction structure, according to yet another implementation. As shown in FIG. 3, IGBT 300 is implemented as a vertical power device including P type collector 310 at bottom surface 304 of semiconductor substrate 302, and N type drift region 314 situated over P type collector 310. In addition, P type base 316 is situated over N type drift region 314. As further shown in FIG. 3, IGBT 300 includes N type buffer layer 312, as well as N type emitter diffusions 328 and P type contacts 318 formed in P type base 316. Moreover, IGBT 300 further includes N type enhancement layer 340 situated between N type drift region 314 and P type base 316.

IGBT 300 also includes first gate trench 320a and second gate trench 320b, each extending from top surface 306 of semiconductor substrate 302, through P type base 316, through N type enhancement layer 340, and into N type drift region 314. As further shown in FIG. 3, each of first gate trench 320a and second gate trench 320b is bordered by N type emitter diffusions 328, and includes gate insulator 322 and gate electrode 324. In addition, IGBT 300 includes inter-trench superjunction structure 330, situated in N type drift region 314 between first gate trench 320a and second gate trench 320b, and extending to a depth 338 below top surface 306 of semiconductor substrate 302.

As shown in FIG. 3, inter-trench superjunction structure 330 includes one or more N type regions 334 in the form of N type conductive pillar(s) (hereinafter "N type conductive pillar(s) 334") and two or more P type regions 336 in the form of P type conductive pillars (hereinafter "P type conductive pillars 336"). One or more N type conductive pillar(s) 334 and two or more P type conductive pillars 336 are configured to substantially charge-balance inter-trench superjunction structure 330.

IGBT 300 corresponds in general to IGBT 100, in FIG. 1. That is to say, semiconductor substrate 302, P type collector 310, N type buffer layer 312, and N type drift region 314, in FIG. 3, correspond respectively in general to semiconductor substrate 102, P type collector 110, N type buffer layer 112, and N type drift region 114, in FIG. 1, and may share any of the characteristics attributed to those corresponding features, above.

In addition, P type base 316, P type contacts 318, and N type emitter diffusions 328, in FIG. 3, correspond respectively in general to P type base 116, P type contacts 118, and N type emitter diffusions 128, in FIG. 1 and may share any of the characteristics attributed to those corresponding features, above. Moreover, first gate trench 320a and second gate trench 320b, each including gate insulator 322 and gate electrode 324, in FIG. 3, correspond respectively in general to first gate trench 120a and second gate trench 120b, each including gate insulator 122 and gate electrode 124, in FIG. 1, and may share any of the characteristics attributed to those corresponding features, above.

As shown in FIG. 3, N type enhancement layer 340 is situated between N type drift region 314 and P type base 316. For example, phosphorus or arsenic dopants may be implanted into N type drift region 314 to produce N type enhancement layer 340 having a doping concentration of from approximately $1 \times 10^{15}/cm^3$ to approximately $1 \times 10^{16}/cm^3$.

Inter-trench superjunction structure 330 and depth 338, in FIG. 3, correspond in general to inter-trench superjunction structure 130 and depth 138, in FIG. 1, and may share any of the characteristics attributed to those corresponding features, above. In other words, one or more N type conductive pillar 334 and two or more P type conductive pillars 336 of inter-trench superjunction structure 330 correspond in general to one or more N type conductive pillars 134 and two or more P type conductive pillars 136 of inter-trench superjunction structure 130, and may share any of the characteristics attributed to those corresponding features, above.

As shown in FIG. 3, in some implementations, inter-trench superjunction structure 330 may include multiple N type conductive pillars 334 and multiple P type conductive pillars 336. However, in all implementations, the number of P type conductive pillars 336 exceeds the number of N type conductive pillar(s) 334.

In one implementation, for example, inter-trench superjunction structure 330 may include two P type conductive pillars 336 and one N type conductive pillar 334 situated between and adjoining the two P type conductive pillars 336. In another exemplary implementation, inter-trench superjunction structure 330 may include multiple N type conductive pillars 334 and multiple P type conductive pillars 336, where each N type conductive pillar 334 is situated between two P type conductive pillars 336.

As noted above, N type conductive pillar(s) 334 and P type conductive pillars 336 are configured to substantially charge-balance inter-trench superjunction structure 330. During turn-off of IGBT 300, the depletion region extends rapidly from the top of N type drift region 314 to N type buffer layer 312 due to the two-dimensional fast depletion of N type conductive pillar(s) and P type conductive pillars 336, which also enables fast extraction of deep charge carriers.

As a result, the delay time and turn-off time of IGBT 300 can be reduced, while voltage blocking in the off-state is facilitated by the presence of inter-trench superjunction structure 330. During turn-off, charge-balanced inter-trench superjunction structure 330 assists in removal of charge carriers from N type drift region 314, which is conductivity modulated, thereby significantly enhancing the switching speed and turn-off performance of IGBT 300. In other words, charge-balanced inter-trench superjunction structure 330 enables IGBT 300 to have lower $E_{OFF}$, shorter $T_d$, and shorter $T_f$, when compared to conventional IGBTs. Moreover, the above advantages may be achieved while maintaining $V_{ON}$ of IGBT 300 at a desirably low level.

Figure 4:
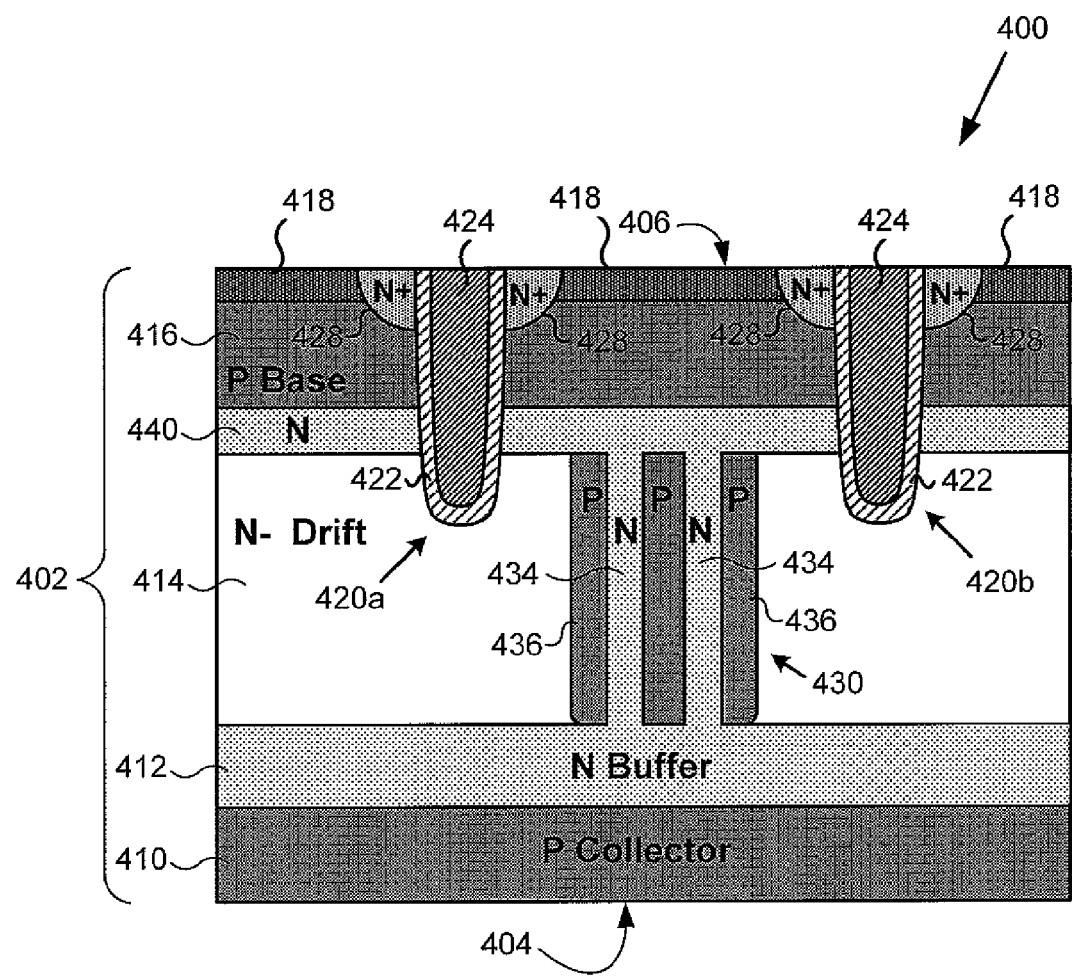
FIG. 4 presents a cross-sectional view showing a portion of an exemplary IGBT having an inter-trench superjunction structure, according to a further implementation.

Referring now to FIG. 4, FIG. 4 presents a cross-sectional view showing a portion of exemplary IGBT 400 having a charge-balanced inter-trench superjunction structure, according to a further implementation. As shown in FIG. 4, IGBT 400 is implemented as a vertical power device including P type collector 410 at bottom surface 404 of semiconductor substrate 402, and N type drift region 414 situated over P type collector 410. In addition, P type base 416 is situated over N type drift region 414. As further shown in FIG. 4, IGBT 400 includes N type buffer layer 412, as well as N type emitter diffusions 428 and P type contacts 418 formed in P type base 416. Moreover, IGBT 400 further includes N type enhancement layer 440 situated between N type drift region 414 and P type base 416.

IGBT 400 also includes first gate trench 420a and second gate trench 420b, each extending from top surface 406 of semiconductor substrate 402, through P type base 416, through N type enhancement layer 440, and into N type drift region 414. As further shown in FIG. 4, each of first gate trench 420a and second gate trench 420b is bordered by N type emitter diffusions 428, and includes gate insulator 422 and gate electrode 424. In addition, IGBT 400 includes inter-trench superjunction structure 430, situated in N type drift region 414 between first gate trench 420a and second gate trench 420b.

As shown in FIG. 4, inter-trench superjunction structure 430 includes one or more N type regions 434 in the form of N type conductive pillar(s) (hereinafter "N type conductive pillar(s) 434") and two or more P type regions 436 in the form of P type conductive pillars (hereinafter "P type conductive pillars 436"). One or more N type conductive pillar(s) 434 and two or more P type conductive pillars 436 are configured to substantially charge-balance inter-trench superjunction structure 430.

IGBT 400 corresponds in general to IGBT 100, in FIG. 1. That is to say, semiconductor substrate 402, P type collector 410, N type buffer layer 412, and N type drift region 414, in FIG. 4, correspond respectively in general to semiconductor substrate 102, P type collector 110, N type buffer layer 112, and N type drift region 114, in FIG. 1, and may share any of the characteristics attributed to those corresponding features, above.

In addition, P type base 416, P type contacts 418, and N type emitter diffusions 428, in FIG. 4, correspond respectively in general to P type base 116, P type contacts 118, and N type emitter diffusions 128, in FIG. 1 and may share any of the characteristics attributed to those corresponding features, above. Moreover, first gate trench 420a and second gate trench 420b each including gate insulator 422 and gate electrode 424, in FIG. 4, correspond respectively in general to first gate trench 120a and second gate trench 120b each including gate insulator 122 and gate electrode 124, in FIG. 1, and may share any of the characteristics attributed to those corresponding features, above. Furthermore, N type enhancement layer 440, in FIG. 4, corresponds in general to N type enhancement layer 340, in FIG. 3, and may share any of the characteristics attributed to that corresponding feature, above.

Inter-trench superjunction structure 430 in FIG. 4, correspond in general to inter-trench superjunction structure 130, in FIG. 1, and may share any of the characteristics attributed to that corresponding feature, above. In other words, one or more N type conductive pillar 434 and two or more P type conductive pillars 436 of inter-trench superjunction structure 430 correspond in general to one or more N type conductive pillars 134 and two or more P type conductive pillars 136 of inter-trench superjunction structure 130, and may share any of the characteristics attributed to those corresponding features, above.

As shown in FIG. 4, in some implementations, inter-trench superjunction structure 430 may include multiple N type conductive pillars 434 and multiple P type conductive pillars 436. However, in all implementations, the number of P type conductive pillars 436 exceeds the number of N type conductive pillar(s) 434.

In one implementation, for example, inter-trench superjunction structure 430 may include two P type conductive pillars 436 and one N type conductive pillar 434 situated between and adjoining the two P type conductive pillars 436. In another exemplary implementation, inter-trench superjunction structure 430 may include multiple N type conductive pillars 434 and multiple P type conductive pillars 436, where each N type conductive pillar 434 is situated between two P type conductive pillars 436.

It is noted that inter-trench superjunction structure 430 is not situated under first gate trench 420a or under second gate trench 420b. That is to say, inter-trench superjunction structure 430 is situated between first gate trench 420a and second gate trench 420b, but does not extend under either of first gate trench 420a or second gate trench 420b.

Moreover, according to the exemplary implementation shown in FIG. 4, inter-trench superjunction structure 430 extends through N type drift region 414 to adjoin N type buffer layer 412. In other words, in some implementations, inter-trench superjunction structure 430 adjoins N type enhancement layer 440 while concurrently adjoining N type buffer layer 412. As a result, in implementations in which inter-trench superjunction structure 430 adjoins both N type enhancement layer 440 and N type buffer layer 412, inter-trench superjunction structure 430 can form multiple PN junctions with N type drift region 414. For example, as shown in FIG. 4, N type drift region 414 may adjoin two of P type conductive pillars 436 to form two PN junctions with inter-trench superjunction structure 430, while not adjoining any N type conductive pillar(s) 434.

As noted above, N type conductive pillar(s) 434 and P type conductive pillars 436 are configured to substantially charge-balance inter-trench superjunction structure 430, as discussed above by reference to inter-trench superjunction structure 130. As a result, during turn-off of IGBT 400, the depletion region extends rapidly from the top of N type drift region 414 to N type buffer layer 412 due to the two-dimensional fast depletion of N type conductive pillar(s) 434 and P type conductive pillars 436, which also enables fast extraction of deep charge carriers.

Consequently, the delay time and turn-off time of IGBT 400 can be reduced, while voltage blocking in the off-state is facilitated by the presence of inter-trench superjunction structure 430. During turn-off, charge-balanced inter-trench superjunction structure 430 assists in the removal of charge carriers from N type drift region 414, which is conductivity modulated, thereby significantly enhancing the switching speed and turn-off performance of IGBT 400.

Thus, the present application discloses implementations of an IGBT having a charge-balanced inter-trench superjunction structure. As disclosed in the present application, incorporating such a charge-balanced inter-trench superjunction structure into the IGBT enables the IGBT to have lower $E_{OFF}$, shorter $T_d$, and shorter $T_f$, when compared to conventional IGBTs. Moreover, these advantages may be achieved while maintaining the $V_{ON}$ of the IGBT at a desirably low level.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. An insulated-gate bipolar transistor (IGBT) comprising:
    a drift region having a first conductivity type situated over a collector having a second conductivity type opposite said first conductivity type;
    first and second gate trenches extending through a base having said second conductivity type into said drift region;
    an inter-trench superjunction structure situated in said drift region between said first and second gate trenches, said inter-trench superjunction structure comprising at least one first conductivity region having said first conductivity type and at least two second conductivity regions having said second conductivity type situated between said first and second gate trenches;
    wherein said inter-trench superjunction structure is spaced apart laterally from said first gate trench by a first portion of said drift region; and
    wherein said inter-trench superjunction structure is spaced apart laterally from said second gate trench by a second portion of said drift region.

2. The IGBT of claim 1, wherein said inter-trench superjunction structure comprises one said first conductivity region and two said second conductivity regions, said first conductivity region situated between said two second conductivity regions.

3. The IGBT of claim 1, wherein said inter-trench superjunction structure comprises a first plurality of said first conductivity regions and a second plurality of said second conductivity regions, said second plurality being greater than said first plurality.

4. The IGBT of claim 1, wherein said inter-trench superjunction structure comprises a first plurality of said first conductivity regions and a second plurality of said second conductivity regions, and wherein each of said first conductivity regions is situated between two of said second conductivity regions.

5. The IGBT of claim 1, wherein said inter-trench superjunction structure is not situated under said first gate trench or said second gate trench.

6. The IGBT of claim 1, wherein said inter-trench superjunction structure adjoins said base.

7. The IGBT of claim 1, wherein said drift region adjoins two of said at least two second conductivity regions but does not adjoin said at least one first conductivity region.

8. The IGBT of claim 1, further comprising an enhancement layer having said first conductivity type situated between said drift region and said base, wherein said inter-trench superjunction structure adjoins said enhancement layer.

9. The IGBT of claim 1, further comprising a buffer layer having said first conductivity type situated between said collector and said drift region, said inter-trench superjunction structure being spaced apart from said buffer layer by said drift region.

10. The IGBT of claim 1, further comprising a buffer layer having said first conductivity type situated between said collector and said drift region, said inter-trench superjunction structure adjoining said buffer layer.

11. An insulated-gate bipolar transistor (IGBT) comprising:
a drift region having a first conductivity type situated over a collector having a second conductivity type opposite said first conductivity type;
first and second gate trenches extending through a base having said second conductivity type into said drift region;
an inter-trench superjunction structure situated in said drift region between said first and second gate trenches, said inter-trench superjunction structure comprising at least one conductive pillar having said first conductivity type and at least two conductive pillars having said second conductivity type situated between said first and second gate trenches and extending toward said collector;
wherein said inter-trench superjunction structure is spaced apart laterally from said first gate trench by a first portion of said drift region; and
wherein said inter-trench superjunction structure is spaced apart laterally from said second gate trench by a second portion of said drift region.

12. The IGBT of claim 11, wherein said inter-trench superjunction structure comprises one conductive pillar having said first conductivity type and two conductive pillars having said second conductivity type, said one conductive pillar having said first conductivity type situated between said two conductive pillars having said second conductivity type.

13. The IGBT of claim 11, wherein said inter-trench superjunction structure comprises a first plurality of conductive pillars having said first conductivity type and a second plurality of conductive pillars having said second conductivity type, and wherein said second plurality is greater than said first plurality.

14. The IGBT of claim 11, wherein said inter-trench superjunction structure comprises a first plurality of conductive pillars having said first conductivity type and a second plurality of conductive pillars having said second conductivity type, and wherein each of said conductive pillars having said first conductivity type is situated between two of said conductive pillars having said second conductivity type.

15. The IGBT of claim 11, wherein said inter-trench superjunction structure is not situated under said first gate trench or said second gate trench.

16. The IGBT of claim 11, wherein said inter-trench superjunction structure adjoins said base.

17. The IGBT of claim 11, wherein said drift region adjoins two of said at least two conductive pillars having said second conductivity type, but does not adjoin said at least one conductive pillar having said first conductivity type.

18. The IGBT of claim 11, further comprising an enhancement layer having said first conductivity type situated between said drift region and said base, wherein said inter-trench superjunction structure adjoins said enhancement layer.

19. The IGBT of claim 11, further comprising a buffer layer having said first conductivity type situated between said collector and said drift region, said inter-trench superjunction structure being spaced apart from said buffer layer by said drift region.

20. The IGBT of claim 11, further comprising a buffer layer having said first conductivity type situated between said collector and said drift region, said inter-trench superjunction structure adjoining said buffer layer.

* * * * *